(12) United States Patent  
Viswanathan et al.

(10) Patent No.: US 9,673,162 B2
(45) Date of Patent: Jun. 6, 2017

(54) HIGH POWER SEMICONDUCTOR PACKAGE SUBSYSTEMS

(75) Inventors: Lakshminarayan Viswanathan, Phoenix, AZ (US); Scott M. Hayes, Chandler, AZ (US); Scott D. Marshall, Chandler, AZ (US); Mahesh K. Shah, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 13/613,979

(22) Filed: Sep. 13, 2012

(65) Prior Publication Data

US 2014/0070397 A1 Mar. 13, 2014

(51) Int. Cl.
*H01L 29/10* (2006.01)
*H01L 23/00* (2006.01)
*H01L 23/367* (2006.01)
*H01L 23/538* (2006.01)
*H01L 23/498* (2006.01)
(Continued)

(52) U.S. Cl.
CPC .......... *H01L 24/24* (2013.01); *H01L 23/3677* (2013.01); *H01L 23/5389* (2013.01); *H01L 24/19* (2013.01); *H01L 24/32* (2013.01); *H01L 24/82* (2013.01); *H01L 24/83* (2013.01); *H01L 21/561* (2013.01); *H01L 23/3121* (2013.01); *H01L 23/49816* (2013.01); *H01L 2224/24137* (2013.01); *H01L 2224/48091* (2013.01); *H01L 2224/48137* (2013.01); *H01L 2224/73265* (2013.01); *H01L 2224/73267* (2013.01); *H01L 2224/92244* (2013.01); *H01L 2224/92247* (2013.01); *H01L 2924/10253* (2013.01); *H01L 2924/12042* (2013.01); *H01L 2924/181* (2013.01); *H01L 2924/19107* (2013.01); *H01L 2924/3025* (2013.01)

(58) Field of Classification Search
CPC ....... H01L 23/34; H01L 23/36; H01L 23/367; H01L 23/42; H01L 23/433; H01L 23/4334
USPC ........ 257/706, 707; 438/106, 119, 121, 122, 438/125–127
See application file for complete search history.

(56) References Cited

U.S. PATENT DOCUMENTS 5,353,498 A * 10/1994 Fillion et al. ................... 29/840
5,403,465 A   4/1995 Apperson et al.
5,431,803 A   7/1995 DiFranco et al.
(Continued)

FOREIGN PATENT DOCUMENTS

| CN | 101399433 A | 4/2009 |
| CN | 201303213 Y | 9/2009 |
| CN | 101615690 A | 12/2009 |

*Primary Examiner* — Victoria K Hall (57) ABSTRACT

A method and apparatus for incorporation of high power device dies into smaller system packages by embedding metal "coins" having high thermal conductivity into package substrates, or printed circuit boards, and coupling the power device dies onto the metal coins is provided. In one embodiment, the power device die can be attached to an already embedded metal coin in the package substrate or PCB. The power device die can be directly coupled to the embedded metal coin or the power device die can be attached to a metallic interposer which is then bonded to the embedded metal coin. In another embodiment, the die can be attached to the metal coin and then the PCB or package substrate can be assembled to incorporate the copper coin. Active dies are coupled to each other either through wire bonds or other passive components, or using a built-up interconnect.

10 Claims, 8 Drawing Sheets

(51) Int. Cl.
*H01L 23/31* (2006.01)
*H01L 21/56* (2006.01)

(56) References Cited

U.S. PATENT DOCUMENTS

| | | | | |
|---|---|---|---|---|
| 5,596,231 A * | 1/1997 | Combs | H01L 23/4334 | 257/712 |
| 5,644,163 A * | 7/1997 | Tsuji | H01L 23/13 | 257/705 |
| 5,793,118 A * | 8/1998 | Nakajima | H01L 21/565 | 257/706 |
| 6,624,523 B2 * | 9/2003 | Chao | H01L 23/24 | 257/693 |
| 6,670,751 B2 * | 12/2003 | Song | H01L 33/641 | 257/E25.02 |
| 6,861,750 B2 * | 3/2005 | Zhao | H01L 23/3677 | 257/666 |
| 6,882,042 B2 * | 4/2005 | Zhao | H01L 23/16 | 257/706 |
| 6,922,339 B2 * | 7/2005 | Nakamura | H01L 23/3677 | 165/185 |
| 6,930,032 B2 | 8/2005 | Sarihan et al. | | |
| 7,038,311 B2 * | 5/2006 | Woodall | H01L 23/3677 | 257/706 |
| 7,241,645 B2 * | 7/2007 | Zhao | H01L 23/3677 | 257/706 |
| 7,251,133 B2 | 7/2007 | Wallace | | |
| 7,396,700 B2 * | 7/2008 | Hsu | H01L 23/36 | 257/706 |
| 7,404,251 B2 | 7/2008 | Buchwalter et al. | | |
| 7,410,816 B2 * | 8/2008 | Gore | B41J 2/16 | 438/116 |
| 7,723,164 B2 * | 5/2010 | Lu | H01L 21/4882 | 257/707 |
| 7,791,189 B2 * | 9/2010 | Zhao | H01L 23/24 | 257/710 |
| 7,821,117 B2 | 10/2010 | Brown et al. | | |
| 7,863,090 B2 | 1/2011 | Eichelberger et al. | | |
| 7,892,882 B2 | 2/2011 | Leal et al. | | |
| 7,923,826 B2 * | 4/2011 | Takahashi | H01L 21/561 | 257/675 |
| 8,004,079 B2 * | 8/2011 | Tain | H01L 25/0657 | 257/706 |
| 8,129,734 B2 * | 3/2012 | Mazzochette | H01L 33/641 | 156/512 |
| 8,217,506 B2 * | 7/2012 | Louh | H01L 23/24 | 257/690 |
| 8,446,003 B2 * | 5/2013 | Komura | H01L 23/3677 | 257/684 |
| 8,524,535 B2 * | 9/2013 | Sakamoto | H01L 21/568 | 257/E21.501 |
| 8,685,790 B2 * | 4/2014 | Magnus | H01L 23/4334 | 257/E21.498 |
| 8,686,558 B2 * | 4/2014 | Zhao | H01L 23/16 | 257/706 |
| 8,946,879 B2 * | 2/2015 | Goida | H01L 23/367 | 257/415 |
| 9,093,416 B2 * | 7/2015 | Mengel | H01L 23/3677 | |
| 9,312,231 B2 * | 4/2016 | Viswanathan | H01L 24/13 | |
| 2004/0212051 A1 * | 10/2004 | Zhao | H01L 23/13 | 257/672 |
| 2005/0139995 A1 * | 6/2005 | Sarraf et al. | | 257/706 |
| 2006/0186536 A1 * | 8/2006 | Hsu | H01L 23/36 | 257/720 |
| 2006/0214535 A1 | 9/2006 | Salmon | | |
| 2006/0237827 A1 * | 10/2006 | Wu | H01L 21/56 | 257/676 |
| 2006/0273451 A1 * | 12/2006 | Kawabata | H01L 23/3114 | 257/706 |
| 2008/0003720 A1 * | 1/2008 | Lu | H01L 21/50 | 438/113 |
| 2008/0201944 A1 * | 8/2008 | Sakamoto | H01L 21/4846 | 29/846 |
| 2008/0206926 A1 * | 8/2008 | Sakamoto | H01L 21/568 | 438/110 |
| 2008/0230914 A1 * | 9/2008 | Sakamoto | H01L 21/568 | 257/762 |
| 2008/0246165 A1 * | 10/2008 | Hess | H01L 23/50 | 257/784 |
| 2008/0277154 A1 | 11/2008 | Buchwalter et al. | | |
| 2009/0023248 A1 * | 1/2009 | Abdo | H01L 23/4334 | 438/112 |
| 2009/0032933 A1 | 2/2009 | Tracht et al. | | |
| 2009/0146277 A1 * | 6/2009 | Tabata | H05K 3/325 | 257/674 |
| 2009/0263939 A1 * | 10/2009 | Sakamoto | H01L 21/568 | 438/126 |
| 2009/0294947 A1 * | 12/2009 | Tain | H01L 25/0657 | 257/686 |
| 2009/0309213 A1 * | 12/2009 | Takahashi | H01L 21/561 | 257/707 |
| 2009/0321924 A1 * | 12/2009 | Funakoshi | H01L 23/4735 | 257/722 |
| 2010/0013088 A1 * | 1/2010 | Davis | H01L 21/50 | 257/701 |
| 2010/0031088 A1 * | 2/2010 | Nakayama | | 714/15 |
| 2010/0052151 A1 * | 3/2010 | Zhao | H01L 23/16 | 257/692 |
| 2010/0059273 A1 | 3/2010 | Montbach et al. | | |
| 2010/0081302 A1 | 4/2010 | Atkinson et al. | | |
| 2010/0081303 A1 | 4/2010 | Roth et al. | | |
| 2010/0148357 A1 | 6/2010 | Yang et al. | | |
| 2010/0187670 A1 * | 7/2010 | Lin | H01L 21/76898 | 257/686 |
| 2010/0282504 A1 | 11/2010 | Chang et al. | | |
| 2010/0295170 A1 * | 11/2010 | Komura | H01L 23/3677 | 257/700 |
| 2011/0062578 A1 * | 3/2011 | Katagiri | H01L 21/6835 | 257/712 |
| 2011/0068445 A1 * | 3/2011 | Lin | H01L 24/83 | 257/675 |
| 2011/0089529 A1 * | 4/2011 | Fowlkes | H01L 23/3677 | 257/528 |
| 2011/0104828 A1 * | 5/2011 | Balucani | H01L 21/6835 | 438/3 |
| 2011/0254147 A1 * | 10/2011 | Otsuka | H01L 21/50 | 257/692 |
| 2011/0318885 A1 * | 12/2011 | Zhao | H01L 23/16 | 438/124 |
| 2012/0139095 A1 * | 6/2012 | Manusharow | H01L 23/36 | 257/690 |
| 2012/0306067 A1 * | 12/2012 | Tsao | H01L 21/561 | 257/692 |

* cited by examiner

HIGH POWER SEMICONDUCTOR PACKAGE SUBSYSTEMS

BACKGROUND

Field

This disclosure relates generally to semiconductor device packaging, and more specifically, to providing packages incorporating high power device die coupled to copper coins embedded in package substrates.

Related Art

Many wireless communication systems and other radio-frequency applications use power amplifiers for increasing the power of a signal. These systems often require use of high power transistors and other high power components that need a heat dissipation structure. Traditionally, the high power components are provided as a separately packaged device which is soldered to a printed circuit board that has a copper heat transfer component.

An issue with the traditional method of incorporating high power components as a packaged device is that this results in a large size of systems having those components. Each component is added as a separate package; for example, some high power transistors are provided in a gull-winged configuration package that is mounted on a printed circuit board (PCB). These configurations can have imperfect transfer of heat to heat sinks incorporated in the PCBs because of poor connections in the large packages. Further, the large component packages can have high parasitic properties, matching circuitry cannot be brought close to the high power device die, and there are significant limitations on device die orientation due to package configuration. All of these features can affect performance, size, and cost of systems incorporating the high power components.

There is also a drive to have smaller system packages, for example, in order to optimize space utilization and to decrease costs associated with large power packages. It is desirable to incorporate thermal device management in these smaller packages along with a more flexible coupling to the package interconnect.

BRIEF DESCRIPTION OF THE DRAWINGS

The present invention may be better understood, and its numerous objects, features, and advantages made apparent to those skilled in the art by referencing the accompanying drawings.

FIG. 1, including

FIG. 2, including

The use of the same reference symbols in different drawings indicates identical items unless otherwise noted. The figures are not necessarily drawn to scale.

DETAILED DESCRIPTION

Embodiments of the present invention provide for incorporation of high power device dies into smaller system packages by embedding metal "coins" having high thermal conductivity into package substrates, or printed circuit boards, and coupling the power device dies onto the metal coins. This allows for the embedded metal coin to be optimized in shape and thickness for thermal or electrical applications of the specific power device die and package substrate. In one set of embodiments, the power device die can be attached to an already embedded metal coin in the package substrate or PCB. In these embodiments, the power device die can be directly coupled to the embedded metal coin or the power device die can be attached to a metallic interposer which is then bonded to the embedded metal coin. In another embodiment, the die can be attached to the metal coin and then the PCB or package substrate can be assembled to incorporate the copper coin. In each of these embodiments, active dies are coupled to each other either through wire bonds or other passive components, or a built-up interconnect can be used to electrically couple active and passive components.

Traditionally, power components are provided to a system using individually packaged components that are coupled to the system PCB. A heat sink is coupled to the power component package. Therefore, there can be multiple connections between a power device die in the component package and the heat sink. This can result in an inefficient transfer of heat from the power device die to the heat sink. In addition, the power component package, along with all the various connections, can take up significant space in the system package. Further, since there are limited provided geometries of the packaged components, the use of those packaged components limits the flexibility of system geometries.

Figure 1A:
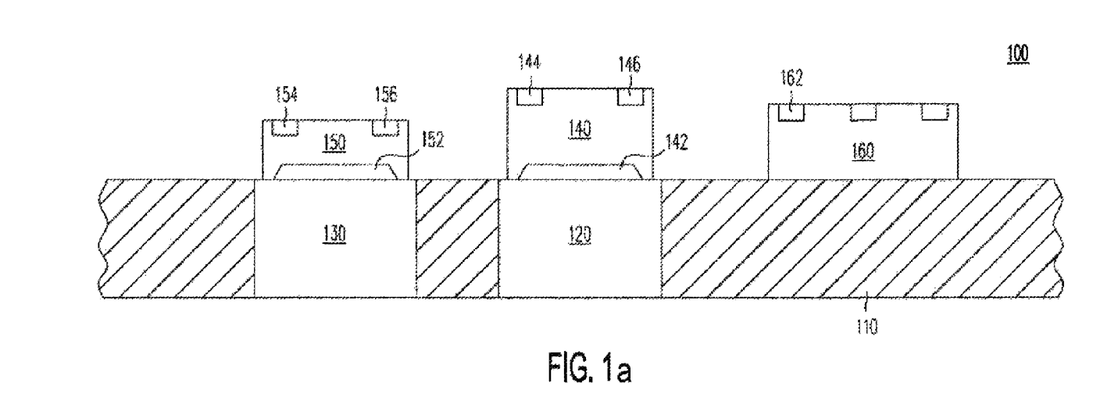
FIGS. 1(a) and 1(b), are is a simplified block diagrams of cross sectional views of semiconductor device structures at stages in processing in which power device die are coupled to metal coins embedded or to be embedded in a PCB or other package substrate, in accordance with embodiments of the present invention.

FIG. 1(a) is a simplified block diagram of a cross sectional view of a system 100 at a stage in processing in which power device die are coupled to metal coins embedded in a PCB or other package substrate, in accord with embodiments of the present invention. System 100 includes a package substrate 110, such as a PCB. Package substrate 110 has embedded metal coins 120 and 130. The metal coins have a high thermal or electrical conductivity, depending upon the application. For many thermal applications, a copper coin is used because of copper's high electrical and thermal properties. Further, copper can be readily incorporated into circuit board designs. In the examples below, the metal coins are specifically discussed to be copper, but other metals (e.g., aluminum) and composites (e.g., AlSiC, Ag diamond, and Cu graphite) with high thermal or electrical conductivity can be used, as the application warrants.

As will be discussed more fully below, embedded copper coins 120 and 130 can be embedded using methods known in the art, as appropriate to the application. Power device die 140 and 150 are coupled to embedded copper coins 120 and 130 respectively. As will be discussed more fully below, the methods for coupling the power device die to the embedded copper coins depend upon the application. Power device die 140 and 150 are coupled to the embedded copper coins at coupling regions 142 and 152, respectively. The coupling regions can be thermal or electrical, depending upon the application. On the major surface of the power device die opposite the major surface including the coupling regions, power device die 140 includes signal pads 144 and 146, while power device die 150 includes signal pads 154 and 156. A device die 160 is shown as adhesively coupled to package substrate 110. Device die 160 can be any component not needing the advantages of being coupled to an embedded copper coin, such as a low power device die or a passive component. Device die 160 includes signal pads, such as signal pad 162, on the major surface opposite that coupled to the package substrate.

Embodiments of the present invention anticipate coupling the power device die to the embedded copper coins in a variety of ways, depending upon whether the copper coin is embedded in a preassembled PCB or is initially separate from a PCB and the PCB then assembled around the copper coin after attachment to the power device die. In those instances where the copper coin is embedded in a preassembled PCB, methods for attaching the power device die to the copper coin take into account temperature limitations associated with processing of a premade PCB. That is, if too a high temperature is used in coupling the power device die to the embedded copper coin, then damage may occur to other areas of the premade PCB.

In one embodiment associated with coupling the power device die to an embedded copper coin in a premade PCB, the coupling can be performed using a low-temperature silver die attach. Low-temperature silver die attach methods known in the art can form an acceptable bond between the silicon die and the copper coin using temperatures of approximately 250° C. Such low-temperature die attach techniques include the use of nanoscale silver pastes or sintered silver, and typically provide better electrical, thermal and thermomechanical properties than traditional solder techniques. As stated above, another advantage of using low-temperature die attach techniques to couple the power device die to the embedded copper coins is avoiding damage to the remaining portions of the PCB.

Figure 2A:
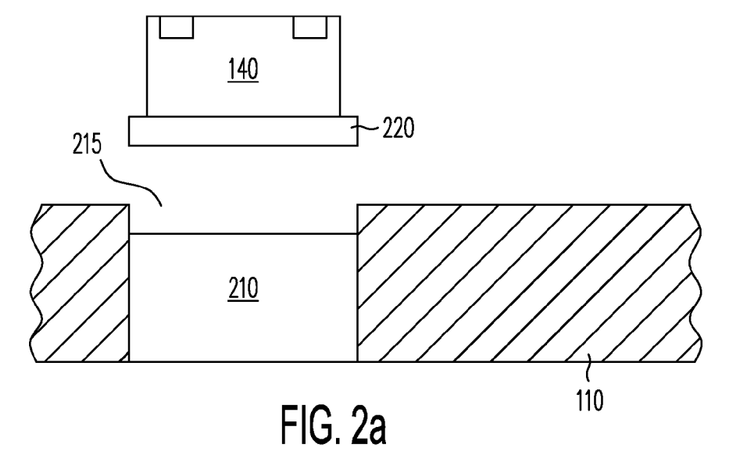
FIGS. 2(a) and 2(b), illustrates another embodiment associated with coupling the power device die to embedded copper coin in a premade PCB.

FIG. 2 illustrates another embodiment associated with coupling the power device die to an embedded metallic coin in a premade PCB. FIG. 2(*a*) is a simplified block diagram illustrating a cross sectional view of a first stage of a process for coupling the power device die to a metallic interposer prior to bonding the die-interposer assembly to a metallic coin embedded in a premade PCB. As discussed above, the embedded metallic coin can be made from a variety of materials having high thermal conductivity (e.g., copper, aluminum, silver diamond, copper graphite, other alloys, and the like). The metallic interposer can be made from the same material as the embedded metallic coin or a different thermally conductive material, as indicated by the application. FIG. 2(*a*) provides substrate 110 with an embedded metallic coin 210. In the illustrated embodiment, embedded metallic coin 210 has a thickness less than that of substrate 110, in order to form a region 215 to accommodate a copper interposer. Power device die 140 is coupled to metallic interposer 220. The die-interposer coupling can be performed, for example, using a metallurgical die attach method.

The metallurgical die attach methods can include, for example, AuSi, AuSn, or Ag die attach. AuSi die attach for high power silicon devices is an in-situ metallurgical reaction between silicon (e.g., the silicon die) and gold (e.g., supplied by gold metallization on the back of the die and on the surface of the interposer). Such die attach methods can result in a nearly void free die bond over a very thin bond area (e.g., approximately 5 microns thick). The absence of voids is important since voids within the bond region can add thermal resistance that can result in hotspots. Further, such metallurgical bonds typically exhibit no hardening or fatigue behavior during or after thermo-mechanical cycling. AuSn die attach is more common with GaAs and GaN die and is typically performed using a preformed or pre-deposited AuSn solder. AuSn die attach can exhibit higher thermal resistance than AuSi die attach.

Figure 2B:
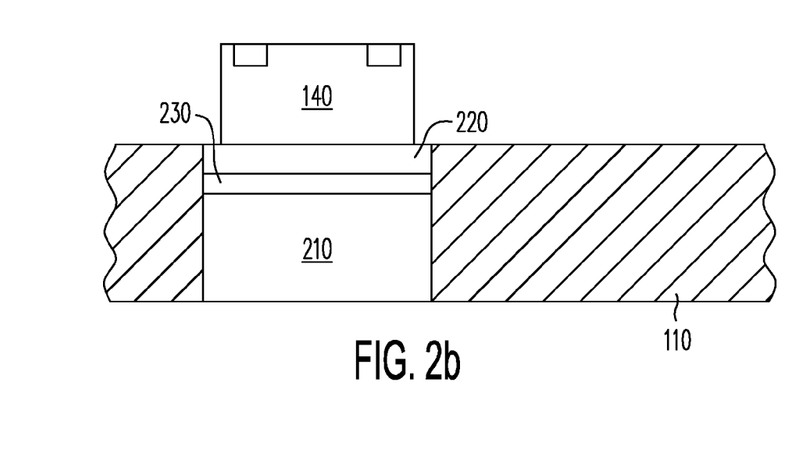

FIG. 2(*b*) is a simplified block diagram illustrating a later stage of a process for coupling the power device die— metallic interposer assembly to the embedded coin. An adhesive layer 230 is applied between embedded metallic coin 210 and metallic interposer 220, and is cured in a manner appropriate to the nature of the adhesive layer. Adhesive layer 230 can include, for example, solder or a conductive epoxy, and selection of which can depend upon the nature of the application. In the illustrated embodiment, metallic interposer 220 is fit into region 215 for bonding with embedded metallic coin 210. In an alternate embodiment, embedded metallic coin 210 can be the same thickness as substrate 110. Then, metallic interposer 220 will sit above the embedded metallic coin and the substrate after bonding.

Again, one advantage of the embedded coin/interposer method is that the substrate (e.g., PCB) is not exposed to the high temperatures used during the metallurgical die attach between power device die 140 and metallic interposer 220, but instead is exposed only to the lower temperature curing associated with adhesive layer 230. This helps to avoid damage to the substrate.

Figure 1B:
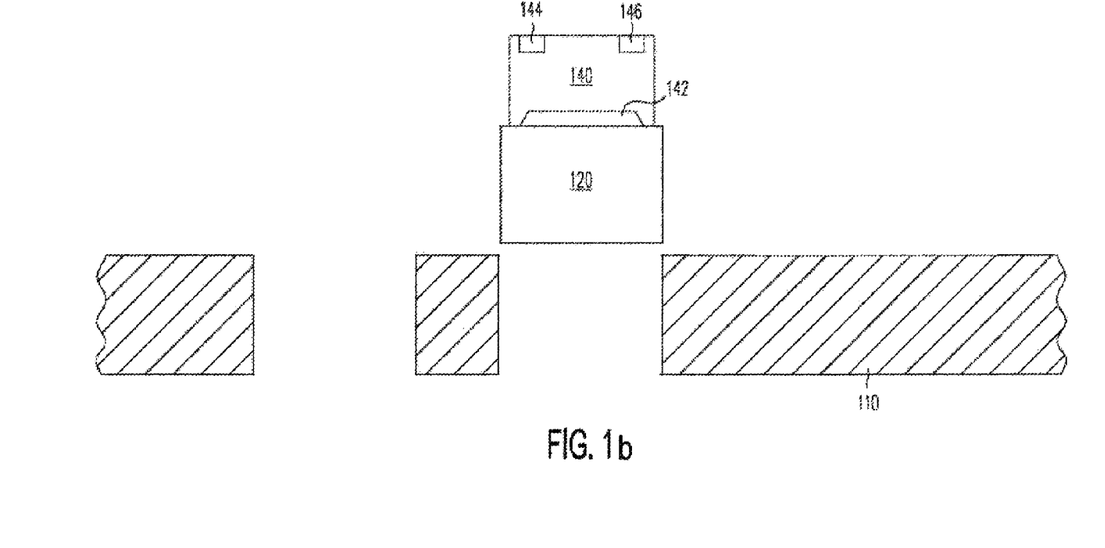

As shown in FIG. 1(*b*), other embodiments can provide for the power device die (e.g. power device die 140) to be coupled to a metallic coin, such as a copper coin 120, prior to embedding the copper coin in the PCB. In such embodiments, the power device die can be coupled to the copper coin using, for example, metallurgical die attach methods that provide low thermal resistance and a low thickness bond region. Metallurgical die attach methods for coupling the power device die to the copper coin can include those discussed above with regard to coupling the power device die to a copper interposer (e.g., AuSi and AuSn die attach). Once coupled, the die-coin assembly can then be incorporated into a package substrate by building the substrate around the copper coin. Alternatively, the copper coin can be inserted into a hole provided in a pre-existing substrate.

Figure 3:
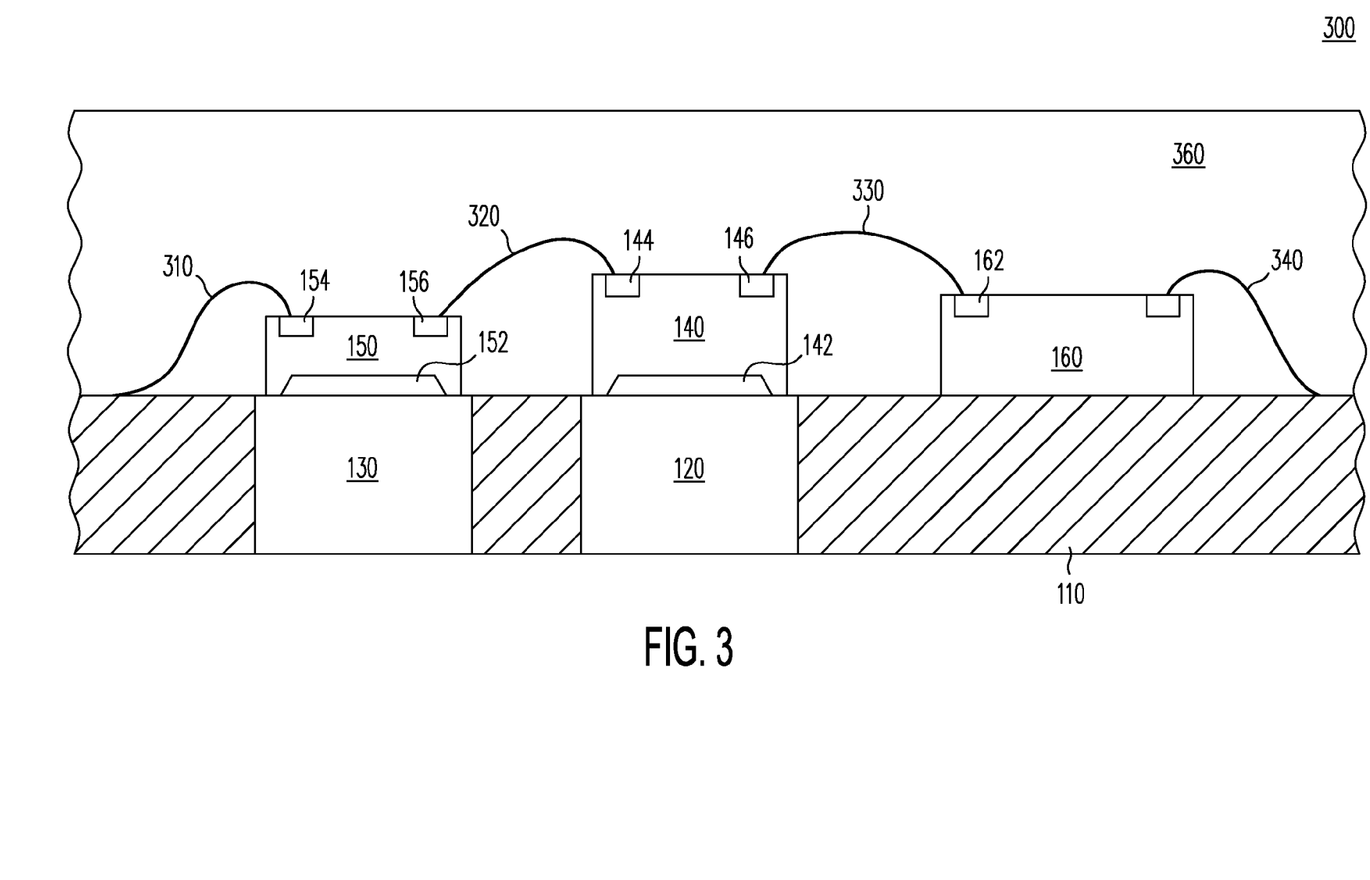
FIG. 3 is a simplified block diagram illustrating a cross sectional view of the device structure at a subsequent step of assembly, in accord with one embodiment of the present invention.

FIG. 3 is a simplified block diagram illustrating a cross sectional view of a system 300 at a stage in assembly subsequent to that illustrated in FIG. 1, in accord with one embodiment of the present invention. Wire bonds 310, 320, 330, and 340 are used to couple the contact pads on the active surface of power device die 140 and 150 and device die 160 with one another and with contact pads provided on substrate 110 (not shown). An interconnect and other circuitry provided on the substrate (not shown) can provide additional connections between the various device die. Subsequent to formation of the communication net provided by the wire bonds, a molding material is applied over and around the power device dies, the device die, wire bonds, and over the substrate, forming an encapsulant 360 that encapsulates the structures within the molding material and forms a panel.

The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, and spin application. Once the molding material is applied, the panel can be cured by exposing the materials to certain temperatures for a period of time, or by applying curing agents, or both. In a typical encapsulation process, a depth of encapsulant 360 can exceed a maximum height of structures embedded in the molding material.

In an alternative embodiment, the wire bonded structures of FIG. 3 can be packaged in an air cavity-type package. In such a case, encapsulant would not be used to cover the various components of the system. Instead, a pre-molded cavity package can be used to surround the various components and a cap can be provided to protect the components within the cavity package. In some instances, a silicone gel can be used to further protect the components by being applied over and around the components and the wire bonds.

In another alternate embodiment, electrical couplings between the various components of the system can be provided by a buildup of interconnect in contact with the various contact pads of the die in the system. Initially, a planarization layer is formed over the various die in order to provide a level platform on which to build the interconnect.

Figure 4:
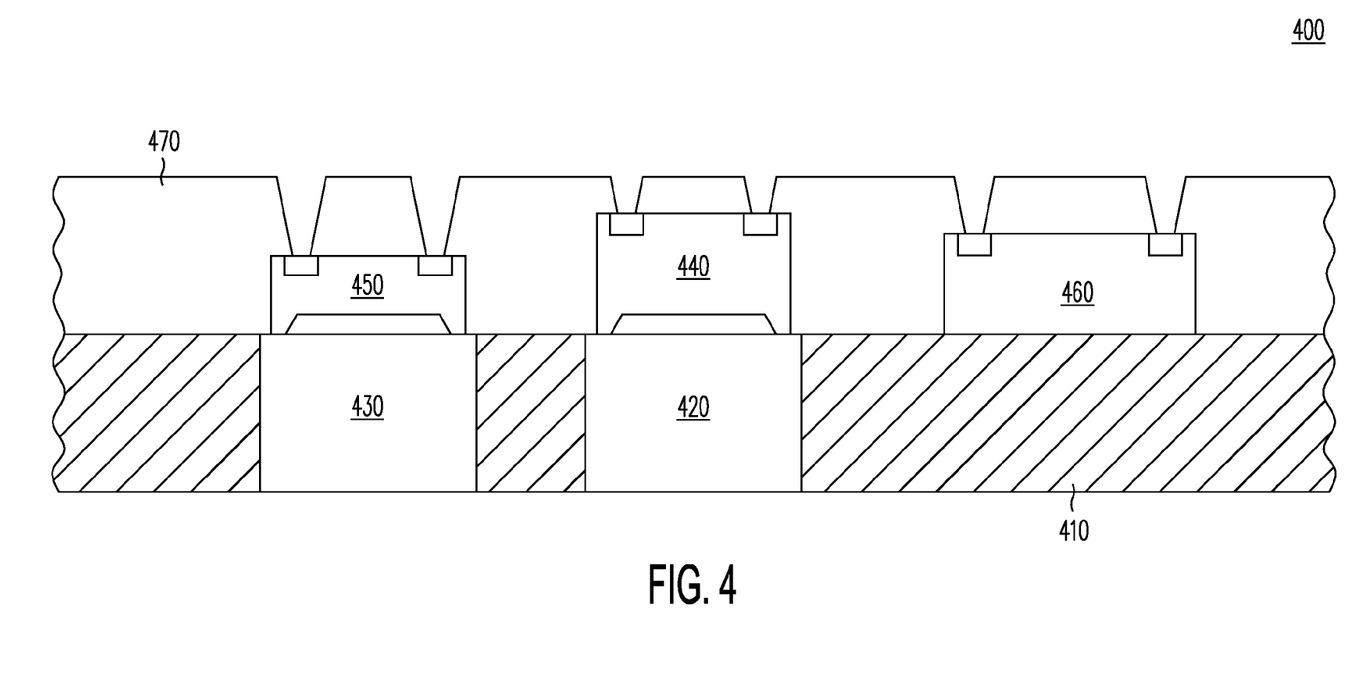
FIG. 4 is a simplified block diagram illustrating a cross sectional view of the device structure at one step in processing of an interconnect system having power device die, in accord with embodiments of the present invention.

FIG. 4 is a simplified block diagram illustrating a cross sectional view of a system 400 at one step in processing of an interconnect system having power device die, in accord with embodiments of the present invention. As with FIG. 1, a system 400 includes a package substrate 410, such as the PCB. Package substrate 410 has embedded copper coins 420 and 430. As discussed above, embedded copper coins 420 and 430 are embedded using methods known in the art, as appropriate to the application. Power device die 440 and 450 are coupled to the embedded copper coins, using methods such as those discussed above. On the major surface of the power device die opposite the major surface coupled to the embedded copper coins, are signal pads. In addition, a device die 460 is also adhesively coupled to package substrate 410. Device die 460 can be any component not needing the advantages of being coupled to an embedded copper coin, such as a low-power device die or a passive component. Device die 460 includes one or more signal pads on the major surface opposite that coupled to the package substrate. In another embodiment, a passive device can also be attached to a copper coin instead of the package substrate, using, for example, an appropriate adhesive (e.g., silver epoxy).

A planarization layer 470 is deposited over and around the device die and over the substrate and exposed regions of the embedded copper coins. Planarization layer 470 can be made from organic polymers, for example, in liquid or dry film and can include a wide range of other materials used for interlayer dielectrics, as known in the art (e.g., silicon dioxide, silicon nitride, silicon oxynitride, or any combination of such layers providing electrical isolation). Planarization layer 470 can be patterned to expose the signal pads of the various device die. Alternatively, via holes to the signal pads can be opened using drilling techniques, such as laser drilling.

Figure 5:
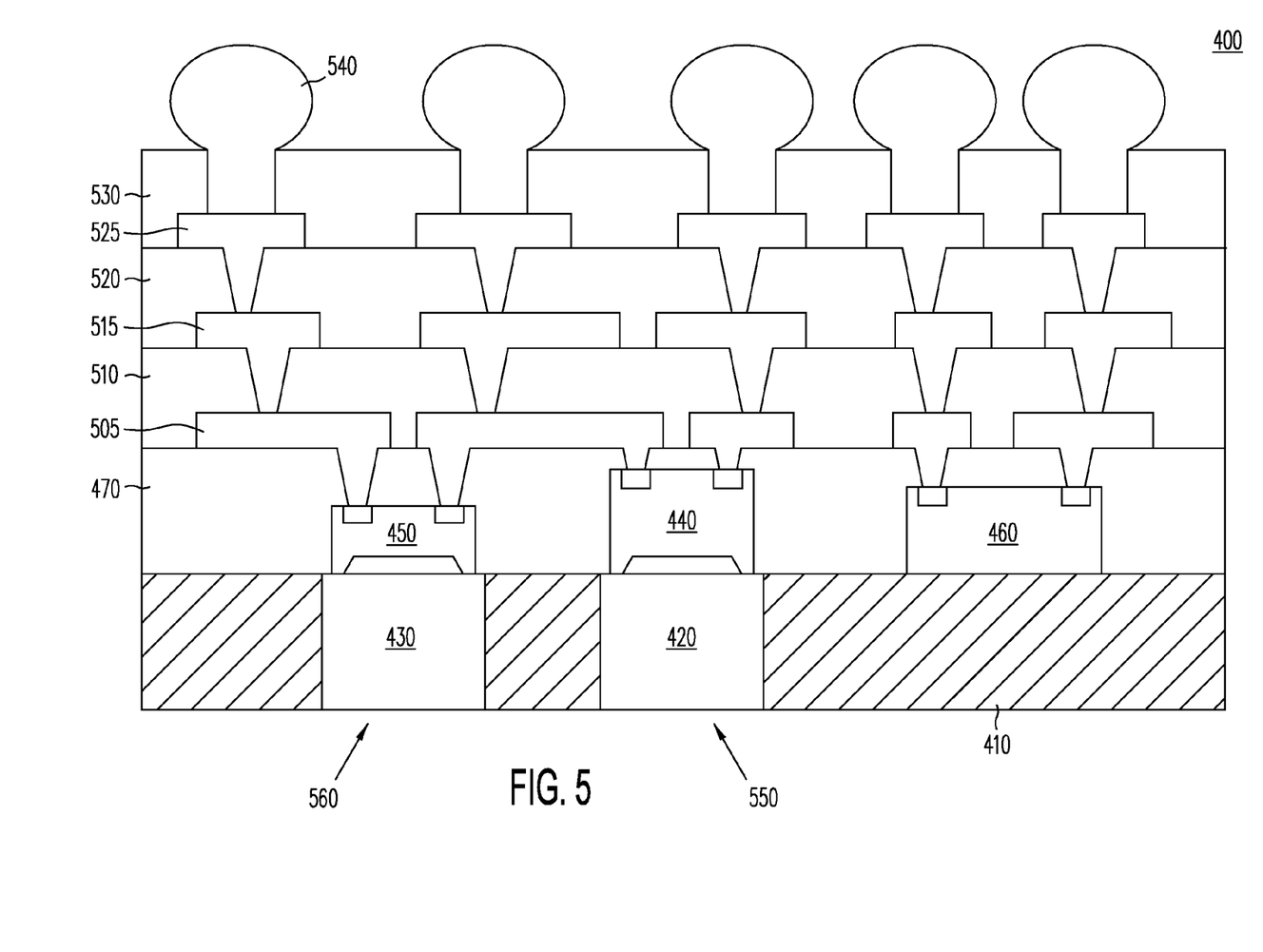
FIG. 5 is a simplified block diagram illustrating a cross-sectional view of the device structure after buildup and ball placement and singulation, according to one embodiment of the present invention.

FIG. 5 is a simplified block diagram illustrating a cross-sectional view of system 400 after buildup and ball placement and singulation, according to one embodiment of the present invention. Standard processing techniques can be used to provide the various layers illustrated in FIG. 5 (e.g., redistributed chip packaging).

A conductive layer 505 can be deposited to provide a portion of an interconnect between the signal pads of the various device die (e.g., power device die 440 and 450, and device die 460). Conductive layer 505 can include materials such as metal, metal alloys, semi-metals, or combinations thereof as known in the art (e.g., aluminum, copper, tantalum, titanium, tungsten, or any metal alloy). Through the use of a conductive layer, any number of bonding pads can be interconnected in any combination to the same or other die. Subsequent to formation of the conductive layer, a patterning process known in the art is performed to provide the desired interconnect for this layer. The interconnect illustrated in FIG. 5 is provided only by way of example, and it should be realized that the interconnects formed by conductive layer 505 and other conductive layers discussed below can extend not only across the page as illustrated but also into and above the page. Further, the interconnect can serve to provide connections between signal pads of different die, or from signal pad to signal pad of the same die, depending on the nature of the application.

Additional interconnect layers can be provided by forming additional insulating layers (e.g., insulating layers 510 and 520) and patterning those insulating layers to receive additional conductive layers (e.g. conductive layers 515 and 525). The range of materials that can be used for subsequent insulating layers and conductive layers can include those listed for planarization layer 470 and conductive layer 505, and each type of layer can be the same or different materials as required by the nature of the application. As will be understood, the built up interconnect layers can incorporate not only interconnect but also other circuit elements and passive devices. Further, as illustrated, a set of conductive ball connectors can be provided by forming insulating layer 530, patterning that layer to expose pads formed in conductive layer 525, and forming and placing conductive balls 540 using standard techniques and materials. Conductive balls 540 can be used to electrically couple the circuitry of device structure 400 with external system elements. For heat dissipation applications, one or more heat sinks can be attached to the surfaces 550 and 560 of copper coins 420 and 430, respectively.

Figure 6:
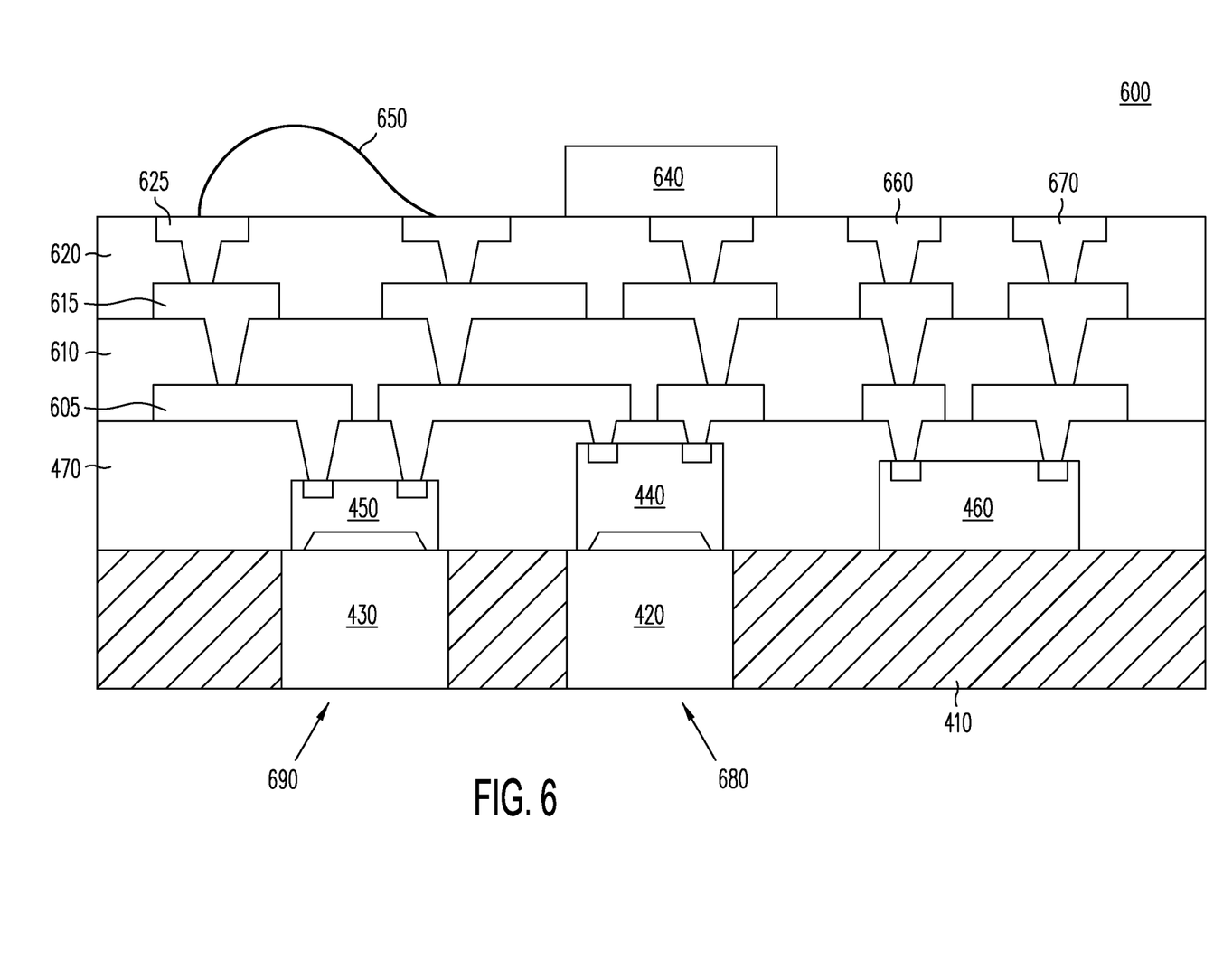
FIG. 6 is a simplified block diagram illustrating a cross-sectional view of device structure after buildup and passive device placement, according to one embodiment of the present invention.

FIG. 6 is a simplified block diagram illustrating a cross-sectional view of system 600 after buildup and passive device placement, according to an alternative embodiment of the present invention. Processing that provides the various layers illustrated in FIG. 6 can be provided by standard techniques used in semiconductor packaging (e.g., RCP).

System 600 includes a conductive layer 605 that is deposited to provide an interconnect between the signal pads of the various device die (e.g., power device die 440 and 450, and device die 460). As discussed above with regard to conductive layer 505, conductive layer 605 can include a variety of conductive materials. Through the use of a patterned conductive layer, as discussed above with regard to FIG. 5, any number of bonding pads can be interconnected in any combination to the same or other die. The interconnect illustrated in FIG. 6 is provided only by way of example, and it should be realized that the interconnects formed by conductive layer 605 and other conductive layers discussed below can extend not only across the page as illustrated but also into and above the page. As with the interconnect in FIG. 5, the interconnect can serve to provide connections between signal pads of different die, or from signal pad to signal pad of the same die, depending on the nature of the application.

Additional interconnect layers can be provided by forming additional insulating layers (e.g., insulating layers 610 and 620) and patterning those insulating layers to receive additional conductive layers (e.g. conductive layers 615 and 625). The range of materials that can be used for subsequent insulating layers and conductive layers can include those listed for planarization layer 470 and conductive layer 605, and each type of layer can be the same or different materials as required by the nature of the application. As will be understood, the built up interconnect layers can incorporate not only interconnect but also other circuit elements and passive devices.

Instead of a bumped interconnect as provided in FIG. 5, FIG. 6 provides for connecting surface-mounted passive devices (e.g., passive device 640) to the interconnect. Passive device 640 can be coupled to the interconnect through a variety of means, including conductors provided on the major surface of the passive device in contact with signal pads on the top major surface of system package 600 or by wire bonds coupled to conductors on a top surface of the passive device. This allows for additional passive devices to those mounted on the substrate (e.g., device 460) to be included in the packaged system. In addition, the system package 600 provides for tuning elements to be incorporated at contacts along the top major surface of system package 600, such as a wire bond 650. The circuitry of package 600 can be coupled to external circuitry using, for example, wire bonds coupled to bond pads 660 and 670. For heat dissipation applications, one or more heat sinks can be attached to the surfaces 680 and 690 of copper coins 420 and 430, respectively.

As the systems of FIGS. 5 and 6 illustrate, one advantage of incorporating power device die into a system using the mechanisms of embodiments of the present invention is the inclusion of interconnect layers above the power device die. This allows for greater flexibility in orienting power device die for system applications. It also allows for including a greater number of power device die in a certain package area.

Figure 7:
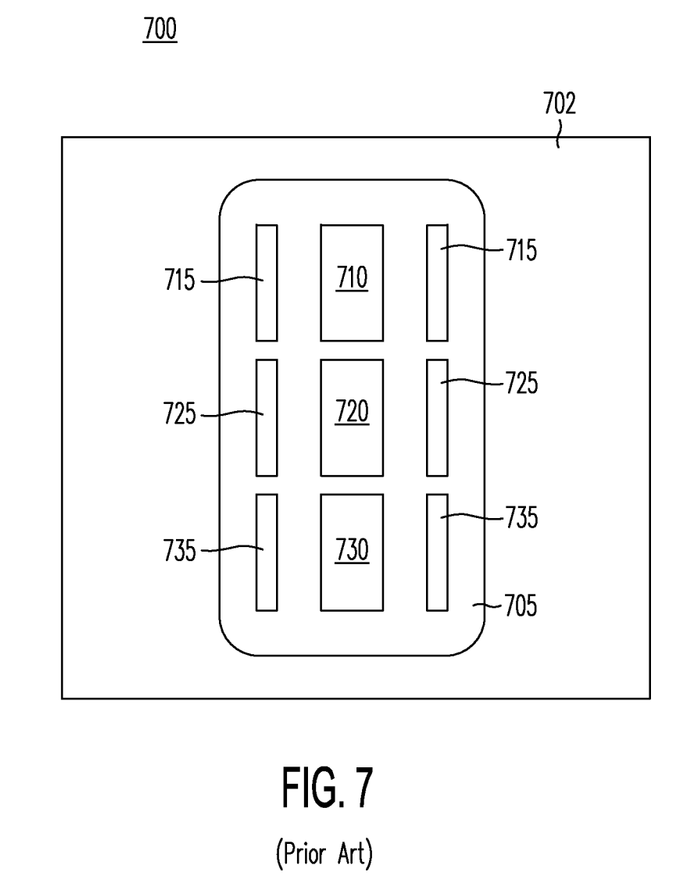
FIG. 7 is a simplified block diagram illustrating a top-down view of an example of a traditional high power transistor package (e.g., a power amplifier) using a single heat sink.

FIG. 7 is a simplified block diagram illustrating a top-down view of an example of a traditional high power transistor package (e.g., a power amplifier) using a single heat sink. High power transistor package 700 is mounted on a system substrate 702. High power transistor package 700 includes a heat sink 705 mounted on the substrate according to traditional methods (e.g., soldered to a heat sink incorporated into the substrate). The high power transistor package includes power transistor die 710, 720, and 730, which are coupled to matching circuits (e.g., capacitors) 715, 725, and 735, respectively.

High power transistor package 700 is typically electrically coupled to the system substrate using fixed connectors such as gull-wing type connectors (not shown). This allows for power flow through the device from one side to the other (e.g., left to right in the figure). Consequently, the configuration of the high power transistor package limits how inputs and outputs are routed to the package. Further, since the high power transistor package is a component coupled to the surface of the system substrate, and the system substrate includes a provision for a heat sink below the high power transistor package, all signal routing must go around the location of the high power transistor package. This can cause difficulties in routing and the fixed nature of the high power transistor package also limits the density of high power components in the system package.

Figure 8:
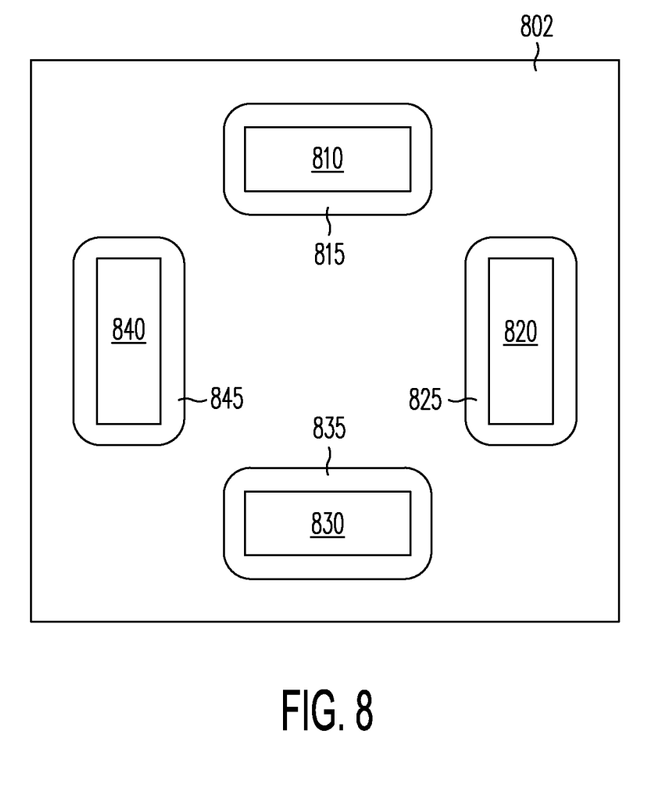
FIG. 8 is a simplified block diagram illustrating a top-down view of an alternative arrangement of high power transistor die facilitated by embodiments of the present invention.

FIG. 8 is a simplified block diagram illustrating a top-down view of an alternative arrangement of high power transistor die facilitated by embodiments of the present invention. The illustrated area of package substrate 802 is intended to be approximately that of the illustrated area of system substrate 702 in FIG. 7. Power transistor device die 810, 820, 830, and 840 are arranged as sides of a square on the system substrate. As discussed above, the power transistor device die are coupled to copper coins 815, 825, 835, and 845, respectively, embedded in the substrate. Matching circuitry (e.g., capacitors and the like) can be provided on the system substrate in locations close to the power device die. Depending on the application, power can flow toward the middle of the square or away from the middle of the square. This is made possible because a built up interconnect can be formed over the power transistor device die to bring signals into the middle of the square or away from the middle of the square. It should be noted that alternative geometries of power device die are made possible by embodiments of the present invention as appropriate to the application, and that embodiments are not limited to any particular geometry.

FIG. 8 illustrates the greater flexibility that embodiments of the present invention provide over traditional approaches for incorporating high power components. FIG. 8 also illustrates that greater densities of power components can be provided by embodiments of the present invention. For example, the illustrated arrangement provides an additional power transistor in the same substrate area as that in FIG. 7. Thus, there can be a 30 percent power increase by using the substrate or interconnect for routing purposes.

Figure 9:
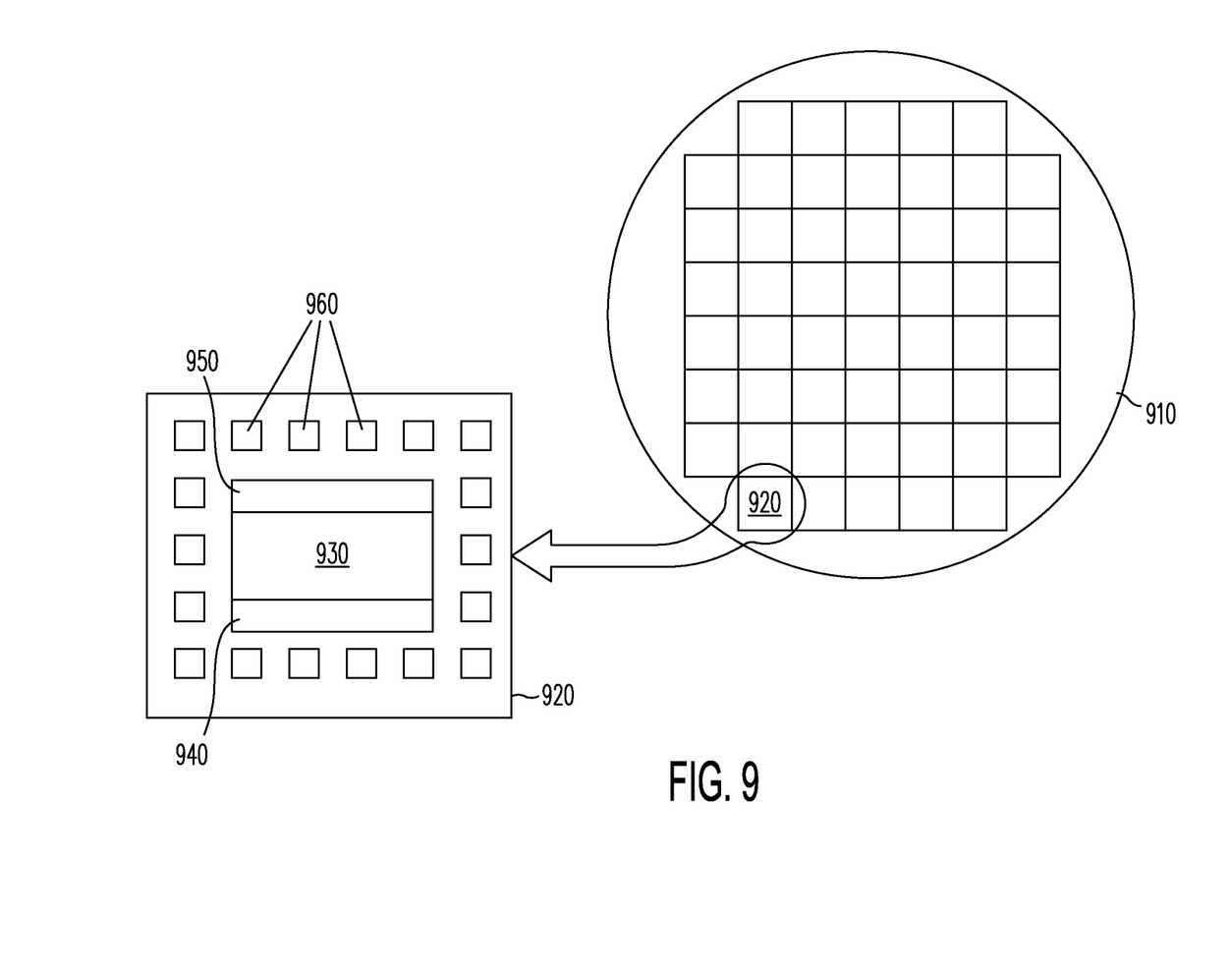
FIG. 9 is a simplified block diagram illustrating another example of an application enabled by embodiments of the present invention.

FIG. 9 is a simplified block diagram illustrating another example of an application enabled by embodiments of the present invention. Unit cells of high power devices (e.g., transistors) can be fabricated on a wafer 910. A unit cell 920 can include the active high power device 930, an input contact 940, an output contact 950, and one or more ground connects 960. The ground connects can provide shielding between each unit cell. Depending on the application, one or more unit cells can be singulated together from the wafer and die attached to a copper coin, as discussed above (e.g., 1×3 cells or 2×6 cells) with regard to power device die 140 and 440. That is, one or more of high power devices 920 can be used for form the power device die discussed above. Electrical coupling between the unit cells can be provided using a built-up interconnect, as discussed above with regard to FIG. 6, for example (in this example, the unit cells would correspond to power device die 440 or 450). Functionality of the end system is determined by the interconnect layers. Again, this illustrates the added flexibility and higher device densities made possible by the present invention.

By now it should be appreciated that there has been provided a method for packaging an electronic device assembly, where the method includes: providing a metallic coin configured for incorporation in a package substrate; coupling a first major surface of a power device die to a first major surface of the metallic coin; embedding the metallic coin into the package substrate; adhesively coupling one or more device die to a first major surface of the package substrate; and electrically coupling the power device die to a device die of the one or more device die. A second major surface of the metallic coin opposite the first major surface of the metallic coin is accessible at a second major surface of the package substrate. The second major surface of the package substrate is opposite the first major surface of the package substrate.

In one aspect of the above embodiment, embedding the metallic coin into the package substrate is performed prior to coupling the first major surface of the power device die to the first major surface of the metallic coin, and coupling the first major surface of the power device die to the first major surface of the metallic coin includes using a metallurgical die attach process at a temperature sufficiently low to avoid damage to the substrate. In a further aspect, the metallurgical die attach process is a sintered silver die attach process.

Another further aspect includes coupling the first major surface of the power device die to a first major surface of a metallic interposer and coupling a second major surface of the metallic interposer to the first major surface of the metallic coin, where coupling the power device die to the metallic interposer is performed prior to coupling the metallic interposer to the metallic coin. Further to this aspect, coupling the power device die to the metallic interposer includes using a metallurgical die attach process and coupling the metallic interposer to the metallic coin includes using a conductive adhesive. Further to this aspect, the metallurgical die attach process includes one of a AuSi, AuSn, or Ag die attach process or a solder process. In another further aspect, the conductive adhesive includes one of a solder or a conductive epoxy.

In another aspect of the above embodiment, embedding the metallic coin into the package substrate is performed after coupling the first major surface of the power device die to the first major surface of the metallic coin, and coupling the first major surface of the power device die to the first major surface of the metallic coin includes using a metallic die attach process providing a low thermal or electrical resistance. Further to this aspect, the metallurgical die attach process includes one of a AuSi, AuSn, or Ag die attach process.

In another aspect of the above embodiment, the metallic coin is a copper coin. In another aspect of the above embodiment, electrically coupling the power device die to the device die of the one or more device die includes forming a wire bond from a power device die signal pad to an electrical contact not on the power device die. The second major surface of the power device die includes one or more signal pads and is opposite the first major surface of the power device die, and the electrical contact not on the power device die is located on one of the substrate or the device die. Further to this aspect, the substrate is a printed circuit board and the electrical contact not on the power device die is coupled to a trace of the printed circuit board. Further to the above aspect, the method further includes forming an encapsulant over and around sides of the power device die, the one or more device die, the wire bonds, and over the substrate. Further to the above aspect, the method further includes providing the package substrate in an air cavity package.

In another aspect of the above embodiment, electrically coupling the power device die to the device die of the one or more device die includes: forming a planarization layer over the substrate and over and around the power device die and the one or more device die where the planarization layer is a dielectric layer; forming a first patterned metallization layer for a package interconnect over the planarization layer; and forming the package interconnect over the first patterned metallization layer from one or more dielectric layers and one or more additional patterned metallization layers. The first patterned metallization layer is electrically coupled with a power device die signal pad through a via formed in the planarization layer and is electrically coupled with a device die signal pad through a via formed in the planarization layer. A second major surface of the power device die includes one or more signal pads. Further to this aspect, the power device die includes one or more substantially similar unit cells, and each of the one or more unit cells includes a power transistor and a plurality of signal contacts.

Another embodiment of the present invention provides a packaged electronic device assembly that includes: a package substrate including an embedded metallic coin; a power device die coupled at a first major surface of the power device die to a first major surface of the metallic coin, and including a plurality of signal contacts on a second major surface of the power device die; one or more device die coupled at a first major surface of the device die to the first major surface of the substrate, and each including one or more signal contacts on a second major surface of the device die; and an interconnect electrically coupling one or more of the signal contacts of the power device die with corresponding signal contacts of one or more of the one or more device die. The metallic coin has a first major surface accessible at a first major surface of the substrate and a second major surface accessible at a second major surface of the substrate. The second major surface of the power device die is opposite the first major surface of the power device die. The second major surface of the device die is opposite the first major surface of the device die.

In one aspect of the above embodiment, the interconnect further includes a wire bond coupling a signal contact of the power device die with an electrical contact not on the power device die where the electrical contact not on the power device die is located on one of the substrate or the device die. In another aspect of the above embodiment, the interconnect further includes: a planarization layer over the substrate and over and around the power device die and the one or more device die where the planarization layer is a dielectric layer; a first patterned metallization layer formed over the planarization layer where the first patterned metallization layer is electrically coupled with a power device die signal contact through a via formed in the planarization layer and is electrically coupled with a device die signal contact through a via formed in the planarization layer; and one or more dielectric layers and one or more additional patterned metallization layers where the one or more dielectric layers and the one or more additional patterned metallization layers are formed over the first patterned metallization layer.

Another aspect of the above embodiment includes a metallurgical die attach forming the coupling of the first major surface of the power device die to the first major surface of the metallic coin. The metallurgical die attach includes one of an AuSi, AuSn, or Ag die attach or a solder die attach.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, a variety of metallic coins having high thermal and/or electrical conductivity can be used, not only copper. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
    providing a power device die for incorporation in a packaged electronic device assembly;
    providing a metallic coin for incorporation in the packaged electronic device assembly and configured for incorporation in a package substrate;
    coupling a first major surface of the power device die to a first major surface of the metallic coin, wherein the metallic coin is formed prior to said coupling;
    embedding the metallic coin into the package substrate, wherein
        said embedding is performed subsequent to said coupling,
        said embedding comprises inserting the metallic coin into a hole provided in the package substrate, and
        the package substrate is preformed;
    adhesively coupling one or more device die to a first major surface of the package substrate, wherein
        a second major surface of the metallic coin opposite the first major surface of the metallic coin is accessible at a second major surface of the package substrate, and
        the second major surface of the package substrate is opposite the first major surface of the package substrate; and
    electrically coupling the power device die to a device die of the one or more device die.

2. The method of claim 1, wherein
    said coupling the first major surface of the power device die to the first major surface of the metallic coin comprises using a metallurgical die attach process providing a low thermal or electrical resistance.

3. The method of claim 2 wherein the metallurgical die attach process comprises one of a AuSi, AuSn, or Ag die attach process.

4. The method of claim 1 wherein the metallic coin comprises a copper coin.

5. The method of claim 1 wherein said electrically coupling the power device die to the device die of the one or more device die comprises:
    forming a wire bond from a power device die signal pad to an electrical contact not on the power device die, wherein
        a second major surface of the power device die comprises one or more signal pads,
        the second major surface of the power device die is opposite the first major surface of the power device die, and
        the electrical contact not on the power device die is located on one of the package substrate or the device die.

6. The method of claim 5 wherein the package substrate is a printed circuit board and the electrical contact not on the power device die is coupled to a trace of the printed circuit board.

7. The method of claim 5 further comprising:
    forming an encapsulant over and around sides of the power device die, the one or more device die, the wire bonds, and over the package substrate.

8. The method of claim 5 further comprising:
    providing the package substrate in an air cavity package.

9. The method of claim 1 wherein said electrically coupling the power device die to the device die of the one or more device die comprises:
    forming a planarization layer over the package substrate and over and around the power device die and the one or more device die, wherein the planarization layer is a dielectric layer;
    forming a first patterned metallization layer for a package interconnect over the planarization layer, wherein
        the first patterned metallization layer is electrically coupled with a power device die signal pad through a via formed in the planarization layer,
        the first patterned metallization layer is electrically coupled with a device die signal pad through a via formed in the planarization layer, and
        a second major surface of the power device die comprises one or more signal pads; and forming the package interconnect over the first patterned metallization layer from one or more dielectric layers and one or more additional patterned metallization layers.

10. The method of claim 9, wherein the power device die comprises one or more substantially similar unit cells, and each of the one or more unit cells comprises a power transistor and a plurality of signal contacts.

* * * * *